May 7, 1963 B. CORNELISON ET AL 3,088,852

MASKING AND FABRICATION TECHNIQUE

Filed Oct. 20, 1959 2 Sheets-Sheet 1

INVENTORS

Boyd Cornelison &
Elmer A. Wolff, Jr.

BY Stevens, Davis, Miller & Mosher

ATTORNEYS

INVENTORS
Boyd Cornelison &
Elmer A. Wolff, Jr.
BY Stevens, Davis, Miller & Mosher
ATTORNEYS 3,088,852

MASKING AND FABRICATION TECHNIQUE

Boyd Cornelison, Dallas, and Elmer A. Wolff, Jr., Richardson, Tex., assignors to Texas Instruments Incorporated, Dallas, Tex., a corporation of Delaware Filed Oct. 20, 1959, Ser. No. 847,631
2 Claims. (Cl. 148—1.5)

The present invention relates to a novel masking and fabrication technique useful in the production of transistor devices. More particularly, the present invention relates to a unique masking technique to be employed when forming alloyed contacts on the surface of a wafer of semiconductor material.

In the production of semiconductor devices, one technique presently in vogue involves diffusing impurity atoms into one surface of a semiconductor wafer of a predetermined conductivity type to form a PN diffusion junction. Thereafter, pairs of contacts are placed onto the diffused surface, one contact forming an ohmic connection and the other contact forming a rectifying connection. These two contacts constitute the base and emitter contacts and are arranged on the diffused surface in closely spaced relation. The contacts are quite small and may take any convenient form, regular or irregular. For example, they may be small bars having dimensions approximately 1 mil x 3 mils. It will be appreciated, however, that there is no limitation upon the shape of the contacts nor upon their size. Since devices of this type are usually employed at high frequencies, the contact areas are made as small as possible and hence their spacing is quite critical.

Prior to the present invention there were essentially two techniques available to form the alloyed contacts on the surface of the wafer. In one technique, two different masks are employed. The first mask defines an opening corresponding in position to one contact of the pair of contacts to be applied to the diffused surface of the wafer. The second mask defines an opening corresponding in position with the second contact of the pair of contacts. The first mask is placed over the semiconductor wafer and the assembly is placed into a vacuum jar or the like and a suitable material is deposited by an evaporation technique through the opening in the mask onto the surface of the semiconductor wafer to form an alloyed contact. Thereafter, the first mask is removed and the second mask placed over the work, and by a similar procedure a second material is evaporated onto the surface of the wafer. This technique has the disadvantage that two complete evaporation steps are necessary to produce the device. Because the mask itself will alloy to the semiconductor wafer if in direct contact therewith, the mask must be spaced very slightly from the wafer. It is almost impossible to move or reindex such a suspended mask within the assembly with the required accuracy and, therefore, the assembly must be removed from the vacuum chamber and the mask carefully reindexed or, the easier process of substituting a slightly different mask, resorted to.

The second technique involves spacing a mask having one opening slightly above the work and using the parallax created by the spaced arrangement to obtain two closely spaced contacts. As before, an evaporation technique is employed. Materials from two spaced sources are evaporated onto the surface of the wafer through the opening in the mask. Since the sources of material are maintained in fixed positions above and with respect to the surface of the semiconductor wafer and the mask is spaced slightly above the semiconductor wafer, there will be a different exposure area for each of the two sources. The lateral offset of the exposure areas will produce the spacing between the deposited contacts. The technique, by its very nature, is restricted to using a very small area for the semiconductor wafer surface. The spacing of the contacts on the surface of the wafer, due to the use of parallax evaporation techniques as described, is a function of the position of the deposited contacts with respect to the two sources that are employed. The spacing of deposited contacts will vary depending upon the location of the exposure areas in a lateral or transverse sense with reference to the two sources of material.

The disadvantages of the above techniques are eliminated by the method of the present invention which involves placing a mask flat on the work, the semiconductor wafer, evaporating a contact onto the work through an opening defined in the mask and then moving the work and mask relative to each other a distance corresponding to the distance desired between contacts plus the width of one contact nad then evaporating the second contact onto the surface of the wafer through the opening which is now at a new position. The materials normally employed for a stencil mask of the type used in the prior art are nickel and Kovar, a trade name for an iron-nickel-cobalt alloy. Although it has generally been accepted that nickel will not form a eutectic with germanium below a temperature of 750° C., it has been discovered in practice that very high purity nickel will form an alloy or bond with germanium at temperatures as low as 400° C. Since temperatures of 400 to 500° C. are normally employed in the evaporation technique of the present invention, it can readily be seen that using a nickel mask and placing it in intimate contact with a germanium semiconductor wafer, as noted above, is risky and could cause the loss of valuable material.

The process of the present invention is made possible by the use of a material for the mask, which material will not bond or alloy to the semiconductor wafer at the process temperatures used. One such material is tungsten, and there are others. However, nearly all of these materials are exceedingly difficult to machine into a form usable as a mask. Thus, the preferred mask for use in practicing the process of the present invention is one of the types disclosed and claimed in an application for patent entitled Masking Device Useful for Making Transistors, Serial No. 847,516, filed on an even date herewith by Elmer A. Wolff, Jr., one of the co-inventors hereof, and assigned to the same assignee as the present application. In that application, it is disclosed that a mask of nickel or Kovar with a thin graphite coating may be held in intimate contact with germanium at temperatures up to and above 500° C. without danger of the mask becoming bonded to the germanium.

As compared with prior art techniques, the method of the present invention is the simplest, most economical and best from a practical and workable standpoint, especially when practiced using the coated mask referred to above. Although the specific example used herein to illustrate the process of this invention is directed specifically to the use of germanium as the semiconductor material for the transistor, it is to be understood that the principles of the present invention are equally applicable to fabrication of transistors wherein silicon or other semiconductor materials are used. However, when the process of the present invention is to be practiced using materials other than germanium, it has been found, so far, to be more practical to use a mask material such as tungsten, which will not bond to the semiconductor material, rather than to use the coated mask.

Accordingly, it is one object of the present invention to provide an improved method for applying critically spaced alloyed emitter and base contacts to diffused base transistor structures, which method is readily adaptable to mass production operations.

It is another object of the present invention to provide a novel masking and fabrication technique wherein a mask defining an opening is placed directly in contact with a wafer of semicoductor material during the vacuum deposition and alloying of a metal contact, and thereafter, without opening the vacuum chamber, the mask and work are moved relative to each other by a distance corresponding to the desired spacing between contacts and a second metal contact deposited on and alloyed to the semiconductor wafer.

Other objects and advantages of the present invention will become more fully apparent from the following detailed description of a single preferred embodiment of the present invention when taken in conjunction with the appended drawings, in which.

Figure 1:
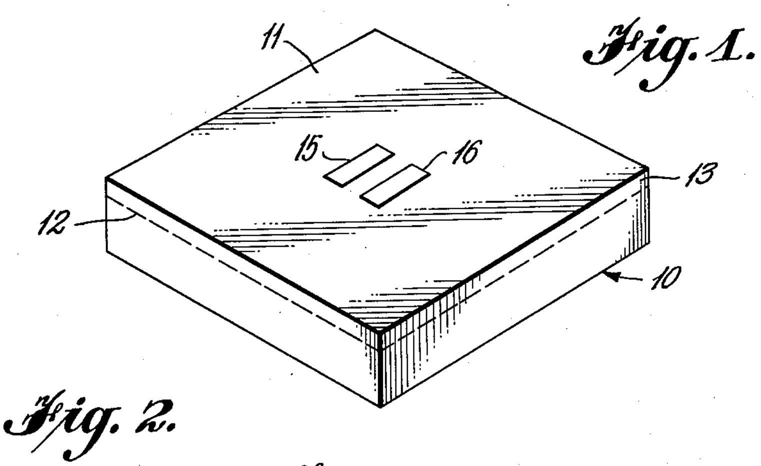
FIGURE 1 illustrates in perspective a semiconductor wafer into one surface of which has been alloyed a pair of metal contacts.

Reference is first made to FIGURE 1, which shows a germanium semiconductor wafer 10 of P-type conductivity. Diffused into the upper surface 11 of the wafer 10 are antimony impurity atoms in an amount sufficient to convert a layer of material 13 adjacent the upper surfaces 11 into N-type conductivity and to define between the regions of P- and N-type conductivity a PN diffused junction, as illustrated by the dotted line 12. Formed onto the diffused surface 11 are two contacts, 15 and 16. Each of the contacts is in the form of a rectangle, and has dimensions approximately 0.001 inch by 0.003 inch. The two bars 15 and 16 are substantially parallel, and are spaced apart a distance corresponding to approximately 0.001 inch. The two bars are deposited onto the diffused surface 11 by means of evaporative techniques conducted under vacuum conditions, and are alloyed with the surface 11 of the wafer 10, preferably simultaneously with the evaporation process. The bar 15 is composed of aluminum and, hence, forms an emitter (rectifying) connection with the N-type conductivity diffused surface 11. The bar 16 is composed of a gold-antimony alloy containing a minor percent of antimony. The amount, however, is sufficient so that the bar 16, when alloyed with the diffused surface 11, forms therewith ohmic contact. Hence, a PNP transistor results, consisting essentially of an emitter in the form of bar 15, a base region constituted by diffused layer 11, and a collector region constituted by the main portion of the germanium wafer 10. The collector contact has not been shown in FIGURE 1. However, it will be appreciated that any suitable contact may be made to the bottom surface of the wafer 10 in order to form an ohmic electrical connection therewith.

In the fabrication of a transistor device, as illustrated in FIGURE 1, it is necessary that contacts 15 and 16 be evaporated onto the surface 11 of the wafer. This is essentially accomplished in a unique way by means of the process of the present invention.

Figure 2:
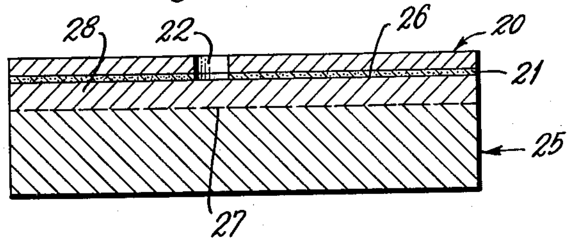
FIGURE 2 illustrates, in section, the step in the process of the present invention wherein a mask is placed upon a germanium semiconductor wafer containing a diffused junction substantially parallel to one surface.

As shown in FIGURE 2, a mask 20 defining a single opening, is placed upon the surface of a semiconductor wafer 25 in intimate contact with the diffused surface 26 of that wafer.

Figure 3:
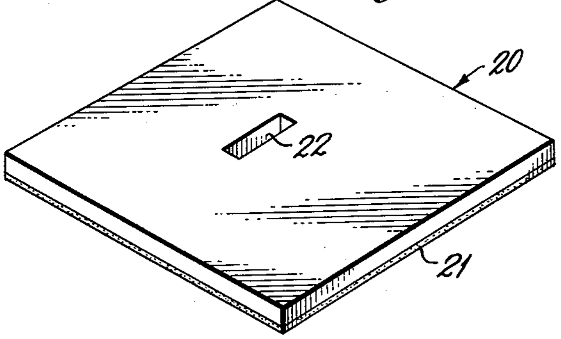
FIGURE 3 illustrates in perspective a graphite-coated nickel mask, especially useful in the practice of the process of the process of the present invention.

There is illustrated in FIGURE 3 a typical mask 20 of the type which may be used carrying out the process of the present invention. The mask 20 is provided with a single opening 22 having dimensions approximately 0.001 inch by 0.003 inch. The mask is of a pure nickel with a carbon film 21 completely coating its lower face in accordance with the principles of the above-mentioned Wolff application. The film is as thin as possible. Such a film may be satisfactorily applied to the mask by the simple expedient of "smoking" the mask over a burning candle. The mask 20, with the film 21, as noted above, is placed into intimate contact with the wafer of semiconductor material 25, such as is illustrated in FIGURE 2, so that the opening, identified by the numeral 22, is positioned to leave exposed an area of the diffused surface 26 of the wafer 25. The mask 20 is placed on the wafer 25 with the carbon film 21 in intimate contact with the surface of the wafer. The wafer illustrated in FIGURE 2 is like the one shown in FIGURE 1 in that it includes a PN diffused junction identified by the reference numeral 27. The layer of the wafer above the junction 27 constitutes a diffused region or a base layer and has been identified by the numeral 28. The reference numeral 26 is used to designate the diffused surface of the wafer 25.

Figure 4:
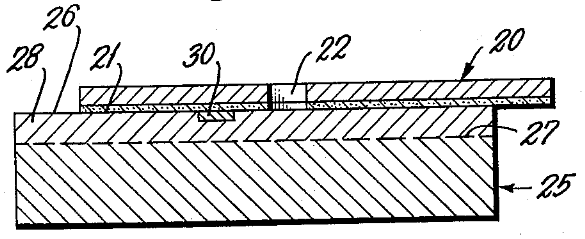
FIGURE 4 illustrates in section the assemblage of FIGURE 2 after an alloyed contact has been deposited onto the surface of the germanium wafer and the mask and germanium wafer have been moved relative to one another so that the opening of the mask rests at a new position with reference to the surface of the wafer.

The mask 20 and wafer 25 are assembled, as shown in FIGURE 2, and placed in a bell jar or other suitable apparatus so that metal or other suitable material may be evaporated upon the diffused surface 26 through the opening 22. During this process, the wafer may be heated to approximately 400 to 500° C. so that as the material deposited is on surface 26, it alloys with the diffused layer 28 and forms a contact, such as the bar 16. The alloyed contact so formed is shown in FIGURE 4 and is designated by the reference numeral 30. Subsequent to the formation of the alloyed contact 30, the assembly is then manipulated, within the vacuum chamber, so that the wafer 25 and mask 20 are moved relatively to each other to offset the opening 22 with reference to the surface 26. Actually, the movement of the mask and work relatively to one another is such as to position the opening 22 with respect to the surface 26 so that it will be laterally displaced a distance from the contact 30 corresponding to the critical spacing desired between contacts. As illustrated in FIGURE 4, the contact 30 has a width of approximately 0.001 inch and the opening 22 is laterally displaced and repositioned on surface 26 a distance of 0.001 inch from the closest edge of the contact 30. With the mask opening in the new position, another material or metal is evaporated onto the surface 26 of the wafer 25 through the opening 22 in the position shown in FIGURE 4 and alloyed to the wafer. As a result, there will be formed on the surface 26 a second contact 31 having a width equal to the width of the opening 22 (see FIGURE 5). The two contacts 30 and 31 will be critically spaced as desired. These contacts 30 and 31 will function as the emitter and base contacts, respectively, for the transistor device.

Figure 5:
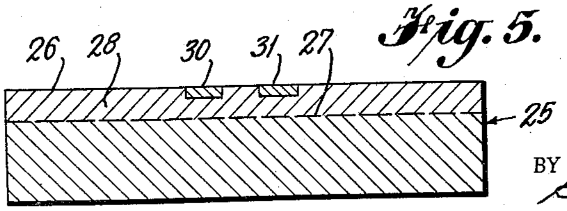
FIGURE 5 illustrates in section the completed semiconductor wafer after the second evaporation.

The wafer 25 as shown in FIGURES 2, 4 and 5 may be a germanium semiconductor wafer of P type conductivity with an N type diffused region formed therein precisely as described with reference to FIGURE 1. The contacts formed on the surface may be aluminum for contact 30 and gold-antimony for contact 31, also as described with reference to FIGURE 1.

Figures 6, 7:
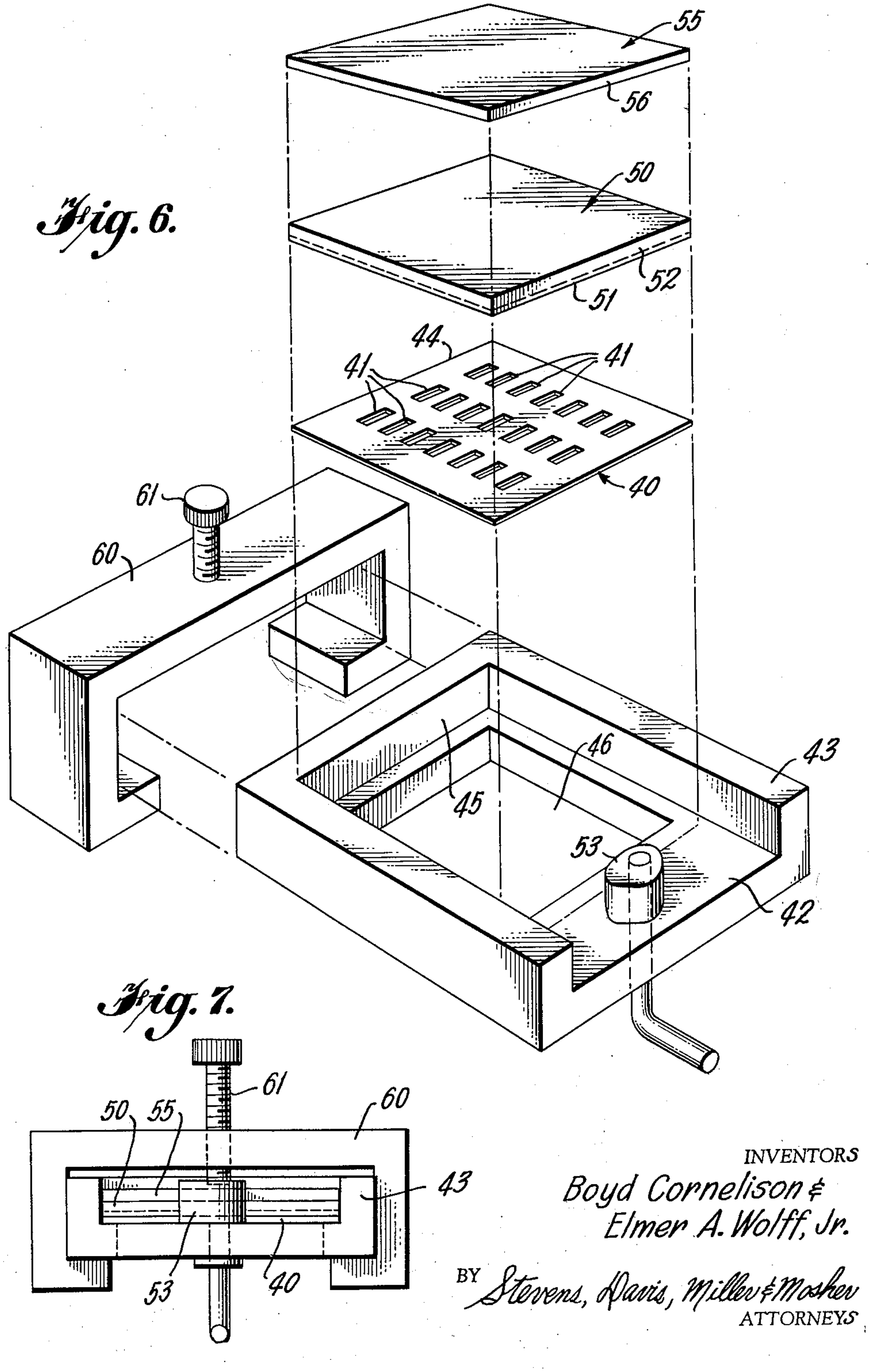
FIGURE 6 is an exploded view illustrating practical apparatus for carrying out the method of the present invention.
FIGURE 7 shows the assembled apparatus of FIGURE 6 in an end elevation of view.

The process of the present invention may be carried out in a quantity production operation using the masking frame and mask illustrated in FIGURES 6 and 7. In the process, a carbon coated mask 40, having a plurality of openings 41 arranged therein, as shown, is placed on the surface 42 of the frame member 43 which defines a square opening 46. The end 44 of the mask 40 is placed tightly against the surface 45 of the frame member 43.

Next, a slab or slice of semiconductor material 50, in which there has been produced a diffused junction 51, as described previously, is placed on top of the mask 40 with its edge 52 tightly against the smallest radius side of eccentric cam 53 and with its opposite end spaced from the surface 45. Backing plate 55, which is the same size as the wafer 50, is then placed on top of the wafer 50, also with its edge 56 against the eccentric cam 53. Clamp 60 is then fitted over the frame and the parts therein and the clamp screw 61 tightened against the backing plate 50 just enough to force the wafer 50 into intimate contact with the mask 40. An end elevation view of the assembly just described is illustrated in FIGURE 7.

The entire assembly is then placed in a vacuum chamber and positioned so that materials may be evaporated through the mask 40 onto the exposed areas of the wafer 50. The chamber is then evacuated and the frame assembly heated to from 400° C. to 500° C. With the assembly at this temperature, aluminum is evaporated onto the exposed portions of the wafer and alloyed thereto. Next, without removing the vacuum from the chamber, the eccentric cam is turned, forcing the wafer 50 and the backing plate 55 to move toward the back surface 45 of the frame. This can, of course, be done by remote control from outside the vacuum chamber without releasing the vacuum. Since the mask 40 cannot and does not move with the wafer and backing plate, a new area of wafer 50 will be exposed through the mask slots 41. Another evaporation and simultaneous alloying step is then carried out, this time with antimony doped gold. The assembly is then removed from the vacuum chamber and the wafer taken from the assembly to be cut into individual transistor units such as illustrated in FIGURE 1, each having ohmic (base) contact of gold antimony and a rectifying (emitter) contact of aluminum.

It will be obvious that the spacing of the two contacts is controlled by the eccentricity of the cam 53. Thus, if the eccentricity of the cam 53 is 0.002 inch, and the width of the mask openings are 0.001 inch, adjacent edges of the contacts will be 0.001 inch apart.

Although germanium has been described as the semiconductor material, it will be appreciated that other semiconductor materials may be employed and are within the contemplation of the invention. Thus, silicon, intermetallic alloys and any other suitable materials are included. Also, there is no limitation as to the device produced. Although the formation of an PNP type transistor has been shown, the invention also applies to the formation of NPN types, as well as variations of NPN and PNP types which may or may not include intrinsic regions. The important consideration is that a means has been described and shown whereby the mask and work may be placed in intimate contact and may be relatively moved one with respect to the other without danger of bonding or alloying. The prime advantage that flows from this discovery is that contacts can be placed accurately and uniformly on a semiconductor body and perhaps equally as important, reproducibly.

The present invention has been shown and described with reference to a single preferred embodiment, but it will be appreciated that changes and modifications may be made from a knowledge of the teachings of the present invention which do not in truth and in fact depart from the concepts of the invention. Hence the invention is not to be limited or restricted to precisely what is shown and described, but rather should be construed in the light of the fundamentally new principles as embodied in the teachings disclosed herein.

What is claimed is:

1. In the fabrication of a semiconductor device, the steps of placing a thin metal mask defining an opening in intimate contact with a surface of a semiconductor body, said mask characterized by a thickness which is small relative to the thickness of the body and by a thin carbon film, having a thickness much less than that of said mask lying between the main portion of said mask and said body to prevent bonding and alloying therebetween, heating said mask and said semiconductor body to an elevated temperature, depositing contact material onto the area of the surface of the semiconductor body exposed by said opening in said mask while maintaining said semiconductor body at said elevated temperature so that the contact material will alloy therewith, moving said mask relative to said semiconductor body, exposing a new area of said body to said opening and depositing contact material onto said new area through said opening in said mask.

2. In the fabrication of a germanium semiconductor device the steps of placing a thin nickel mask defining an opening in intimate contact with a surface of a germanium semiconductor body, said mask characterized by a thickness which is small relative to the thickness of the semiconductor body and by a very thin carbon film lying between the main portion of said mask and said body to prevent bonding and alloying therebetween and depositing contact material onto the area of the surface of the semiconductor body exposed by said opening while maintaining the semiconductor body at an elevated temperature so that the contact material will alloy therewith.

References Cited in the file of this patent

UNITED STATES PATENTS

| | | |
|---|---|---|
| 2,137,831 | Brunke | Nov. 22, 1938 |
| 2,560,594 | Pearson | July 17, 1951 |
| 2,666,814 | Shockley | Jan. 19, 1954 |
| 2,842,466 | Moyer | July 8, 1958 |
| 2,858,246 | Pearson | Oct. 28, 1958 |
| 2,879,188 | Strull | Mar. 24, 1959 |
| 2,962,396 | Pankove | Nov. 29, 1960 |
| 2,969,296 | Walsh | Jan. 24, 1961 |